(12) United States Patent
Althoff et al.

(10) Patent No.: US 7,722,797 B2
(45) Date of Patent: May 25, 2010

(54) METHOD FOR PRODUCING A CERAMIC SUBSTRATE

(75) Inventors: Anke Althoff, St.-Andrä-Wördern (AT); Holger Grabner, Zagersdorf (AT)

(73) Assignee: EPCOS AG, Munich (DE)

( * ) Notice: Subject to any disclaimer, the term of this patent is extended or adjusted under 35 U.S.C. 154(b) by 266 days.

(21) Appl. No.: 10/523,345

(22) PCT Filed: Aug. 4, 2003

(86) PCT No.: PCT/DE03/02611

§ 371 (c)(1),
(2), (4) Date: Oct. 11, 2005

(87) PCT Pub. No.: WO2004/014647

PCT Pub. Date: Feb. 19, 2004

(65) Prior Publication Data

US 2006/0108717 A1 May 25, 2006

(30) Foreign Application Priority Data

Aug. 2, 2002 (DE) .................... 102 35 452

(51) Int. Cl.
*B28B 1/16* (2006.01)
(52) U.S. Cl. ........................ 264/620; 264/619
(58) Field of Classification Search .............. 264/619, 264/620

See application file for complete search history.

(56) References Cited

U.S. PATENT DOCUMENTS

| | | | |
|---|---|---|---|
| 4,627,160 A | 12/1986 | Herron et al. | |
| 4,800,459 A | 1/1989 | Takagi et al. | |
| 5,230,846 A * | 7/1993 | Tamhankar et al. | 156/89.18 |
| 5,252,519 A | 10/1993 | Nakatani et al. | |
| 6,141,847 A * | 11/2000 | Mizuno et al. | 29/25.42 |
| 2001/0022416 A1* | 9/2001 | Harada et al. | 264/643 |

FOREIGN PATENT DOCUMENTS

| | | |
|---|---|---|
| DE | 37 38 343 | 7/1991 |
| DE | 199 45 014 | 3/2001 |
| EP | 0 487 196 | 10/1991 |
| FR | 2 533 313 | 9/1983 |
| GB | 2 130 720 | 9/1983 |
| JP | 2000302558 | 10/2000 |

OTHER PUBLICATIONS

Benumof, Reuben. Concepts in Electricity and Magnetism. New York:Holt, Rinehard and Winston, 1961. 82-85, 100.*

* cited by examiner

*Primary Examiner*—Steven P Griffin
*Assistant Examiner*—Russell J Kemmerle, III
(74) *Attorney, Agent, or Firm*—Fish & Richardson P.C.

(57) ABSTRACT

A method is disclosed for producing a ceramic substrate made of base that includes a stack of layers. Each layer in the stack includes a non-sintered ceramic material and a binder. The method includes debinding the layers in a temperature interval of $T_{E1}$-$T_{E3}$, where $T_{E1}$ is a minimum debinding temperature and $T_{E3} > T_{E1}$, and sintering the layers at a temperature $T_S$, where $T_S \geq T_{E3}$. Debinding and sintering are performed in a same furnace, and a temperature T of the base does not fall below $T_{E1}$ during debinding and sintering.

9 Claims, 1 Drawing Sheet

METHOD FOR PRODUCING A CERAMIC SUBSTRATE

TECHNICAL FIELD

The invention relates to a method for the production of a ceramic substrate comprising a stack of layers stacked on top of one another.

Each of the layers of the stack contains a non-sintered ceramic material and binder, together forming a basic body, which is debinded and sintered.

BACKGROUND

A method is known in which, for example, the decarbonization of the basic body is performed in a batch furnace, which is heated over an extend period of time to a temperature suitable for decarbonization. Then the basic body, cooled to room temperature, is removed from the batch furnace and, together with other already decarbonized basic bodies, placed onto a conveyer belt and fed into a sintering furnace configured for conveyor belts. The use of a continuous process is feasible here, because the sintering is not as time-consuming as the decarbonization.

A disadvantage of the known method is that it is unsuitable for the production of multi-layer substrates made of various ceramic materials having different relative permittivities and generally different coefficients of thermal expansion, in which layers with feedthroughs are provided. It was discovered that during the production of such multi-layer substrates, cracks often occur between the feedthroughs, which are normally made of a metalliferous paste, and the ceramic layer forming the surrounding environment of the feedthrough.

SUMMARY

It is, therefore, the goal of the present invention to provide a method for the production of a ceramic multi-layer substrate, in which the risk of crack development is reduced. This goal is achieved by means of method according to claim 1. Advantageous further developments of the invention are found in the additional claims.

The invention indicates a method for the production of a ceramic substrate, in which a basic body is made available in a first step. The basic body contains a stack of layers stacked on top of one another. The stacked layers each consist of a non-sintered ceramic material, which also contains a binder. The basic body contains electrically conductive vertical ducts, each of which passes through at least one of the layers. In a further step, the layers are preferably debinded in an inert atmosphere (e.g., in an atmosphere containing nitrogen), a minimum temperature being maintained during debinding. In the ensuing step, the basic body is sintered, the sintering taking place at a temperature which is greater that the minimum temperature of debinding. The minimum temperature of debinding is dependent upon the composition of the material to be debinded. Throughout the entire of the two process steps mentioned last, the temperature T of the basic body is maintained at a level that does not fall below the minimum temperature $T_{E1}$ of the debinding.

According to the invention, both debinding and sintering are performed in one and the same furnace. This prevents the ceramic basic body from cooling to room temperature. In addition, this simplifies the method, because switching furnaces is avoided.

An advantage of the method is that it is possible to avoid cooling the basic body to room temperature between debinding and sintering. This is because cooling the basic body to room temperature between debinding and sintering holds the risk that, because of the different coefficients of thermal expansion of the electrically conductive duct and the surrounding layer, cracks can occur. As a result of the method, cooling to room temperature is avoided, also making it possible to reduce the risk of crack development. The basic body is only cooled after sintering, that is, during the stage in which the ceramic materials are already sufficiently stable, thereby reducing the risk of crack development.

Debinding is defined as a process suitable for volatilizing the organic components, especially solvents and binders, from the layers.

It is possible to perform the process steps of debinding and sintering in an air atmosphere. It is also possible to perform debinding and sintering in an inert atmosphere. Another possibility is to convert the atmosphere in the furnace during debinding in order, for example, to control the rate of oxidation of the organic components. Another possible means of controlling the rate of oxidation is a corresponding adjustment of the furnace's temperature program, in which the direction and rate of temperature change is advantageously variable. For example, the temperature can be kept constant or reduced in some time ranges, although the current temperature must always remain above the minimum temperature of debinding.

According to the invention, debinding is performed within a temperature range of $T_{E1}$-$T_{E3}$ ($T_{E1}$<$T_{E3}$), wherein the temperature in one variant of the invention can be increased, essentially monotonically, from $T_{E1}$ to $T_{E3}$ during debinding.

In the preferred variant of the invention, the temperature is initially increased, preferably monotonically, from $T_{E1}$ to $T_{E2}$ ($T_{E1}$<$T_{E2}$<$T_{E3}$). This step is preferably performed in an inert atmosphere, wherein unwanted oxidation of the solvents and binders can be intentionally (temporarily) reduced and/or prevented.

Subsequently, the atmosphere in the furnace is converted to air atmosphere. If the furnace atmosphere is converted at relatively high temperatures>$T_{E2}$, there is a risk that the oxidation of the organic components will occur too quickly and that the carbon dioxide developing in the process will emerge explosively from the layers. To prevent the rapid emergence of carbon dioxide from the layers, the temperature T of the basic body can be reduced, preferably concurrently with the conversion of the atmosphere or immediately thereafter, from $T_{E1}$≦$T_{E1}$<$T_{E3}$. Then the temperature is preferably monotonically increased to the final temperature $T_{E3}$ of debinding.

This is followed by a further increase in the temperature to at least the value required to sinter all layers. Only after sintering is the basic body and/or the multi-layer substrate cooled to room temperature in the furnace and then removed from the furnace.

However, the cooling of the basic body to room temperature only occurs in a stage in which the stability of the ceramic layers is already sufficient to reduce the risk of development of cracks.

Between the layers, structured metallization layers are preferably provided which, like the vertical electric ducts, can be produced using a metalliferous paste.

The stack of layers stacked on top of one another is preferably a stack in which each of the layers containing ceramic material contains openings, which are filled with a metalliferous paste. The advantage of this is that the electrically conductive connections between metal layers disposed on top of one another are easily established.

The layers containing non-sintered ceramic material, which are normally also referred to as green foils, can already be provided with openings prior to formation of the stack. This can be achieved by means of punching, for example. Following the punching, the openings are filled with a metalliferous paste. Only then are the green foils stacked on top of one another and is the basic body produced by means of lamination.

A paste containing precious metals, such as silver and palladium, can be used advantageously as a metalliferous paste.

It is also advantageous if the materials of layers stacked on top of one another in the stack are different and the stack, therefore, contains at least two different ceramic materials. It is possible, for example, to use a ceramic material for a green foil disposed in the interior of the stack which has relative permittivity of approx. $\epsilon=20$. This makes it possible to produce ceramic substrates that contain high-capacity capacitors. Furthermore, it is advantageous to produce the lowest and the higher layer of the stack of layers stack on top of one another by means of a ceramic material with a lower relative permittivity of, for example, $\epsilon=8$.

Furthermore, it is advantageous to select the materials in accordance with the following rule:

A first ceramic material contained in the basic body begins to sinter at a temperature $T_{S1}$. A second ceramic material contained in the basic body begins to sinter at a temperature $T_{S3}$. Furthermore, the metalliferous paste contained in the basic body begins to sinter at a temp $T_{S2}$. In addition, the following applies: $T_{S1}<T_{S2}<T_{S3}$. To obtain a densely sintered basic body, it is preferable to sinter at a temperature that exceeds the sintering temperature $T_{S3}$.

Advantageously, the following can apply to the relative permittivity $\epsilon_1$ of the ceramic material with the smaller relative permittivity: $7 \leqq \epsilon_1 \leqq 8.5$.

In addition, the following can apply to the relative permittivity $\epsilon_1$ of the ceramic material with the larger relative permittivity: $18 \leqq \epsilon_2 \leqq 22$.

A structured metallization layer made of the structured metalliferous paste can be provided on the uppermost layer, below the lowest layers, and between two layers stacked on top of one another. The ducts constitute vertical electrical connections between the metallization layers.

In the following, the invention is explained in greater detail, using an exemplary embodiment and the related figures.

DETAILED DESCRIPTION

Figure 1:
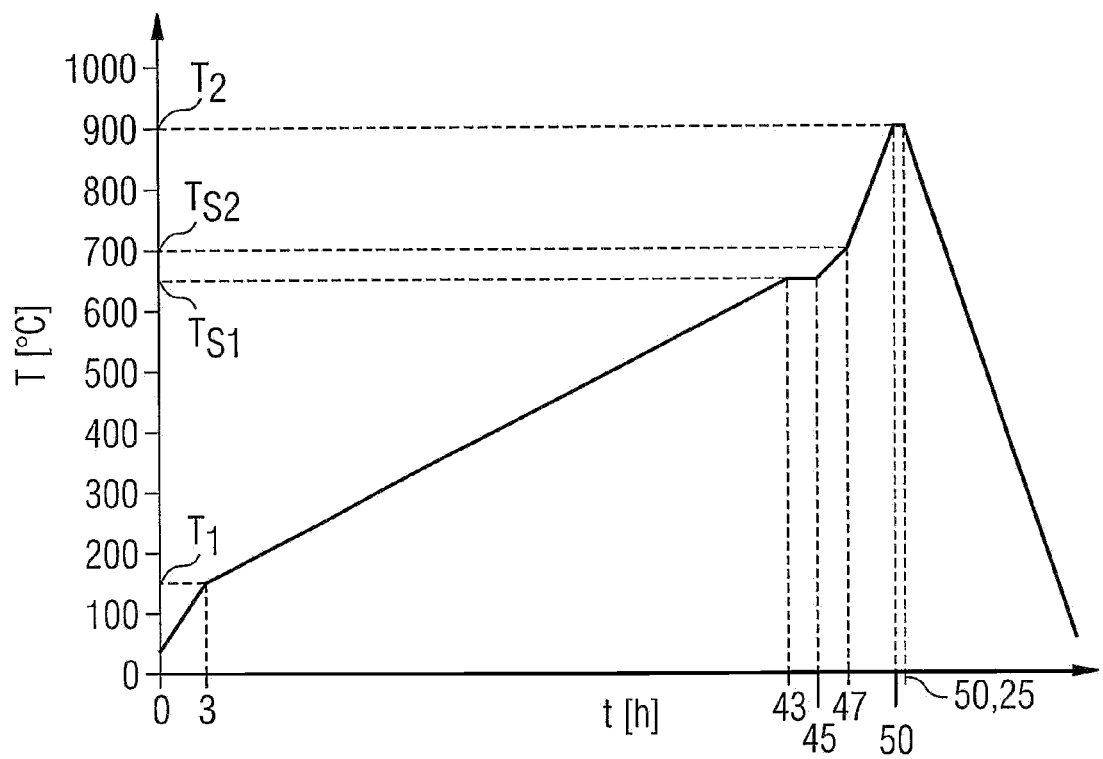
FIG. 1 shows, as an example, the temperature progression during completion of the method according to the invention in a chart in which the temperature is plotted over time.

FIG. 1 shows, as an example, a temperature profile for the use of the method according to the invention to produce a ceramic substrate. One or more basic bodies are heated for a period of three hours from room temperature to a temperature $T_{E1}$ (beginning of debinding). In the example from FIG. 1, $T_{E1}=200°$ C. This is the level below which the temperature should not fall during the debinding. The increase in the temperature to $T_{E1}$ can occur in an air atmosphere or, alternatively, in an inert atmosphere.

Beginning at this temperature, a large fraction of the organic components begins to escape. For this reason, the temperature is preferably increased uniformly and slowly (e.g., for approx. 13 hours), in an inert atmosphere, to a value $T_{E2}$. During the further process, the furnace, in this variant of the invention, is converted to an air atmosphere and, in this process, the temperature is initially reduced again to a value of $T_{E1} \leqq T < T_{E2}$. Without such a temperature reduction, explosion-like deflagration can occur, which can lead to damaging or destruction of the ceramic basic body.

Following the conversion of the furnace to an air atmosphere, the decarbonization process is continued. The temperature of the basic body is now increased to a temperature $T_{E3}$, which is preferably 450° C. and is kept constant for a period of about one hour. At this point, the last organic components of the basic body also escape. Decarbonization is then complete. The ceramic basic body is subsequently heated, in a ramp-like fashion, to the sintering temperature $T_{S1}$, at which the layers 2 of a first ceramic material begin to sinter.

Figure 2:
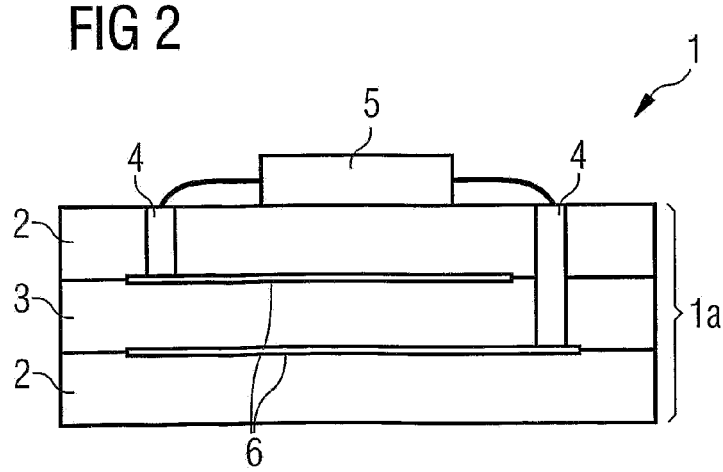
FIG. 2 shows, as an example, a substrate produced by means of the method according to the invention, in schematic cross-section.

A ceramic substrate in accordance with FIG. 2 is considered for the exemplary temperature profile from FIG. 1. The ceramic substrate comprises a basic body 1, which contains a stack 1a of layers 2, 3 stacked on top of one another. The layers 2, 3 stacked on top of one another contain a non-sintered ceramic material, which, in turn, contains additional organic components such as solvents and binders. In this connection, the layers 2 are preferably executed in such a way that after sintering their relative permittivity $\epsilon_1$ is approx. 8. Another layer 3 consisting of a second ceramic material (or at least a partial layer made of the second ceramic material) is disposed between the two layers 2. The second ceramic material is a ceramic material (preferably a so-called K20 material) with a relative permittivity $\epsilon_2$ that differs from $\epsilon_1$. The K20 material is a ceramic material with relative permittivity $\epsilon_2$ of approximately 20. In addition, vertical openings are formed in the layers and are filled with a metalliferous paste, thereby forming electrically conductive ducts 4. Internal electrodes 6 are disposed in the individual plies of the layer 3 in such a way as to form a capacitor. The capacitor is connected, in electrically conductive fashion, with an electric component 5 on the upper side of the basic body 1.

The sintering temperatures of the materials in the layers 2 and 3, and/or in the electrically conductive duct 4, are selected in such a way that the following applies to the sintering temperature $T_{S1}$ of the ceramic material of layer 2, to the sintering temperature $T_{S3}$ of the ceramic material of layer 3, as well as to the sintering temperature $T_{S2}$ of the metalliferous paste: $T_{S1}<T_{S2}<T_{S3}$. According to FIG. 1, the following applies to the temperatures:

$T_{S1}=625°$ C.

$T_{S3}=700°$ C.

From the above, it follows that after ramping up the temperature over an extended period of 40 hours, a temperature of 625° C. is reached, which is the temperature at which the first ceramic material begins to sinter. The temperature is kept constant for about 2 hours, and is then quickly increased to the value $T_S \geqq T_{S3}$, e.g., $T_s=900°$ C. This brings the temperature to a level at which the layers 2, 3 of the ceramic basic body are densely sintered. At the same time, namely during the temperature increase from $T_{S1}$ to $T_S$, the layer 3 of the second ceramic material, with a sintering temperature of $T_{S3}$, as well as the metallic duct and the internal metal coating begin to sinter. This temperature is now held for 0.25 seconds to obtain a thickly sintered ceramic basic body.

Only after all layers and materials of the basic body are sintered is the temperature gradually reduced to room temperature if applicable FIG. 1.

At least one of the layers of the first ceramic material can form a stratified compound with at least one of the layers of the second ceramic material, wherein several of such stratified compounds are preferably formed and wherein each of the structured metallization layers is provided between the stratified compounds.

The present invention is not limited to the production of substrates that contain K8 and/or K20 materials, but instead is applicable to all types of ceramic substrates that contain feedthroughs or electrically ducts.

The invention claimed is:

1. A method of producing a ceramic substrate comprised of a base that comprises layers in a stack, each layer in the stack comprising a non-sintered ceramic material and a binder, the method comprising:

debinding the layers in a temperature interval of $T_{E1}$ to $T_{E3}$, where $T_{E1}$ is a minimum debinding temperature and $T_{E3} > T_{E1}$; and sintering the layers at a temperature $T_S$, where $T_S \geq T_{E3}$;

wherein debinding and sintering are performed in a same furnace;

wherein a temperature T of the base does not fall below $T_{E1}$ during debinding and sintering;

wherein debinding begins at a temperature between $T_{E1}$ and $T_{E2}$ that increases at an increasing rate, where $T_{E1} < T_{E2} < T_{E3}$, whereafter T decreases to a value of $T_{E1'}$, where $T_{E1'} < T_{E1} < T_{E2}$;

wherein a first part of debinding is performed in an atmosphere that is inert; and wherein, during debinding, an atmosphere in the furnace changes from an inert atmosphere to an air atmosphere in accordance with a reduction in temperature to $T_{E1'}$.

2. The method of claim 1, further comprising:
forming the stack of layers;
wherein forming comprises forming openings in the layers and adding a metalliferous paste to at least some of the openings.

3. The method of claim 2, wherein the metalliferous paste comprises silver or silver—palladium.

4. The method of claim 2, wherein the stack of layers comprises a first layer comprised of a first ceramic materials, and a second layer comprised of a second ceramic material, the second layer being above the first layer;

wherein the first ceramic material begins to sinter at a temperature $T_{S1}$, the second ceramic material begins to sinter at a temperature $T_{S3}$, and the metalliferous paste begins to sinter at a temperature $T_{S2}$; and wherein $T_{S1} < T_{S2} < T_{S3}$.

5. The method of claim 4, farther comprising:

forming a stratified compound using the first layer and the second layer, the ceramic substrate comprising plural stratified compounds; and forming structured metallization layers between the stratified compounds.

6. The method of claim 2, wherein forming comprises providing structured metallization layers between layers in the stack comprised of sintered ceramic material, the structured metallization layers comprising the metalliferous paste.

7. The method of claim 1, wherein at least two of the layers comprise different ceramic materials.

8. The method of claim 4, wherein, following sintering, the first ceramic material has a relative permittivity $\epsilon_1$, where $7 \leq \epsilon_1 \leq 8.5$; and wherein, following sintering, the second ceramic material has a relative permittivity $\epsilon_2$, where $18 \leq \epsilon_2 \leq 22$.

9. The method of claim 1, wherein T increases at a substantially constant rate to a value $T_{E3}$ after T decreases to the value of $T_{E1'}$.

* * * * *

UNITED STATES PATENT AND TRADEMARK OFFICE
CERTIFICATE OF CORRECTION

PATENT NO. : 7,722,797 B2
APPLICATION NO. : 10/523345
DATED : May 25, 2010
INVENTOR(S) : Anke Althoff and Holger Grabner It is certified that error appears in the above-identified patent and that said Letters Patent is hereby corrected as shown below:

Title Page, Column 2, Line 2 under Other Publication:
Delete "Rinehard" and Insert --Rinehart--

Column 6, Claim 5, Line 15:
Delete "farther" and Insert --further--

Signed and Sealed this

Twenty-eighth Day of September, 2010

David J. Kappos
*Director of the United States Patent and Trademark Office*